US006555947B2

(12) United States Patent
Bahk et al.

(10) Patent No.: US 6,555,947 B2
(45) Date of Patent: Apr. 29, 2003

(54) PRESSURE-BALANCED UNDERWATER ACOUSTIC TRANSDUCER

(75) Inventors: Kyung Soo Bahk, Kyeonggi-do (KR); Yong Shik Chu, Kyeonggi-do (KR); Hee Jun Lee, Seoul (KR)

(73) Assignee: Korea Ocean Research and Development Institute (KR)

( * ) Notice: Subject to any disclaimer, the term of this patent is extended or adjusted under 35 U.S.C. 154(b) by 0 days.

(21) Appl. No.: 10/080,737

(22) Filed: Feb. 22, 2002

(65) Prior Publication Data

US 2002/0175600 A1 Nov. 28, 2002

(30) Foreign Application Priority Data

May 23, 2001 (KR) ........................................ 2001-28392

(51) Int. Cl.[7] ........................ H04R 17/00; H01L 41/053
(52) U.S. Cl. ........................................ 310/337; 310/335
(58) Field of Search .................................. 310/337, 335

(56) References Cited

U.S. PATENT DOCUMENTS

| | | | | | |
|---|---|---|---|---|---|
| 2,839,735 | A | * | 6/1958 | Van Atta | 367/6 |
| 3,245,251 | A | * | 4/1966 | Von Ardenne | 73/617 |
| 3,325,779 | A | * | 6/1967 | Supernaw et al. | 367/151 |
| 3,641,470 | A | * | 2/1972 | Rembaum et al. | 338/99 |
| 5,291,461 | A | * | 3/1994 | Boeglin et al. | 367/163 |
| 5,627,801 | A | * | 5/1997 | Saunders | 367/139 |
| 5,701,277 | A | * | 12/1997 | Ring et al. | 367/163 |
| 5,757,728 | A | * | 5/1998 | Tenghamn et al. | 367/163 |

OTHER PUBLICATIONS

Benvenuto N. et al. "Joint Detection With Low Computational Complexity For Hybrid TD–CDMA Systems" VTC 1999–Fall. IEEE VTS 50th. Vehicular Technology Conference. Gateway to the 21st Century Communications Village. Amsterdam, Sep. 19–22, 1999, IEEE Vehicular Technology Conference, NY.

Vandaele P. et al. Recursive Total Least Squares Algorithm for Sincle–User Blind Channel Equalisation: IEE Proceedings: Vision, Image and Signal Processing, Instutution of Lectrical Engineers, FB, vol. 147, No. 3, Jun. 23, 2000.

* cited by examiner

*Primary Examiner*—Thomas M. Dougherty
(74) *Attorney, Agent, or Firm*—Cantor Colburn LLP

(57) ABSTRACT

Provided is a pressure-balanced underwater acoustic transducer. The transducer includes an oscillator unit having an oscillator oscillating by an electrical signal supplied to electrodes, provided on its surface, a sound transmission material for transmitting sound from the oscillator, provided at its periphery, and a transducer housing provided at the exterior of the sound transmission material, a sound reflector positioned over the oscillator unit, for reflecting sound propagated from the oscillator, a water entry layer formed at a space between the oscillator unit and the sound reflector to allow water to enter and exit to the rear window of the oscillator, thereby leading to a balanced state of pressures applied to the front and rear windows of the oscillator, and a phase combiner for combining sound reflected from the sound reflector and straight traveling sound generated from the front window of the oscillator into one single phase. Therefore, the effect of underwater pressure on an oscillator is minimized, thereby manufacturing a highly reliable, cost-effective underwater acoustic transducer for deep sea. Also, even when the transducer is used for shallow sea, little deformation occurs over usage time.

7 Claims, 5 Drawing Sheets

PRESSURE-BALANCED UNDERWATER ACOUSTIC TRANSDUCER

BACKGROUND OF THE INVENTION

1. Field of the Invention

The present invention relates to a transducer used in water, and more particularly, to a pressure-balanced underwater acoustic transducer configured not to be affected by the depth of water at which the water pressure is applied to both ends of an oscillating unit, preventing displacement or transformation of the unit due to water pressure.

2. Description of the Related Art

In general, a conventional underwater acoustic transducer having a uni-directionality, as shown in FIG. 1, includes an acoustic window 14 capable of transmitting sound to the front surface of an oscillator 13. The oscillator 13 oscillates by an electrical signal supplied to electrodes and sound waves generated at the oscillator 13 propagate through the water.

A piezoceramic element is generally used as the oscillator 13, and polyurethane or plastic layer is used as the acoustic window 14. A sound-absorbing material 12, usually cork or foam, serving to absorb sound is provided at the rear surface of the oscillator 13. The conventional transducer of the type described herein is incorporated, in general, in a housing 11 thereof and is mostly operated in the surface or shallow depth of water where the displacement or transformation of the transducer is negligible.

In the above-described conventional underwater acoustic transducer, a pressure is applied uni-directionally, that is, only to the front surface of the acoustic window 14. Thus, the operating depth of water and usage time of the transducer are limited depending on the pressure under which the sound-absorbing material 12 can withstand.

Since there is nearly no sound-absorbing material that can withstand underwater as deep as several thousands of meters, the conventional underwater transducer employs a specific plastic layer having a high strength in place of the sound-absorbing material 12.

Since the plastic layer transmits sound well, the sound propagated into the rear surface of the oscillator 13 is transmitted through the plastic layer and reflected back from the housing 11 of the transducer. The reflected sound is combined with the sound propagated to the front surface of the oscillator 13 and travels into water. During combination of two sound waves, phases of the two sound waves must be the same. To this end, it is necessary to adjust the thickness of the plastic layer disposed at the rear surface of the oscillator 13.

However, it is quite difficult to form a plastic layer withstanding at a high pressure. It is also difficult to adjust the thickness of the plastic layer. Thus, it is not easy to manufacture an underwater acoustic transducer for deep sea and high cost is required to manufacture the same. Also, since a pressure is applied in one direction of the transducer, its acoustic characteristics may change according to the depth of water.

SUMMARY OF THE INVENTION

To solve the above-described problems, it is an object of the present invention to provide a pressure-balanced underwater acoustic transducer configured not to be affected by the pressure applied to the transducer and to be least affected by the depth of water.

To accomplish the above object of the present invention, there is provided an underwater acoustic transducer including an oscillator unit having an oscillator oscillating by an electrical signal supplied to electrodes, provided on its surface, a sound transmission material for transmitting sound from the oscillator, provided at its periphery, and a transducer housing provided at the exterior of the sound transmission material, a sound reflector positioned over the oscillator unit, for reflecting sound propagated from the oscillator, a water entry layer forming a space between the oscillator unit and the sound reflector to allow water to enter and exit to the rear window of the oscillator, thereby leading to a balanced state of pressures applied to the front and rear windows of the oscillator unit, and a phase combiner for combining sound reflected from the sound reflector and straight traveling sound generated from the front surface of the oscillator into one single phase.

In the present invention, the transducer housing forming the external shape of the oscillator unit and a sound reflector body forming the external shape of the sound reflector are separatably connected to each other, and the phase of the sound reflected from the sound reflector is adjusted by varying the thickness of the water entry layer according to the distance between connected surfaces of the transducer housing and the sound reflector body.

Also, in order to supply an electrical signal to electrodes of the oscillator, a pin connector is installed at the exterior of the transducer housing using a rubber ring for isolation from water.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

The present invention will now be described in detail with reference to the accompanying drawings.

Figure 1:
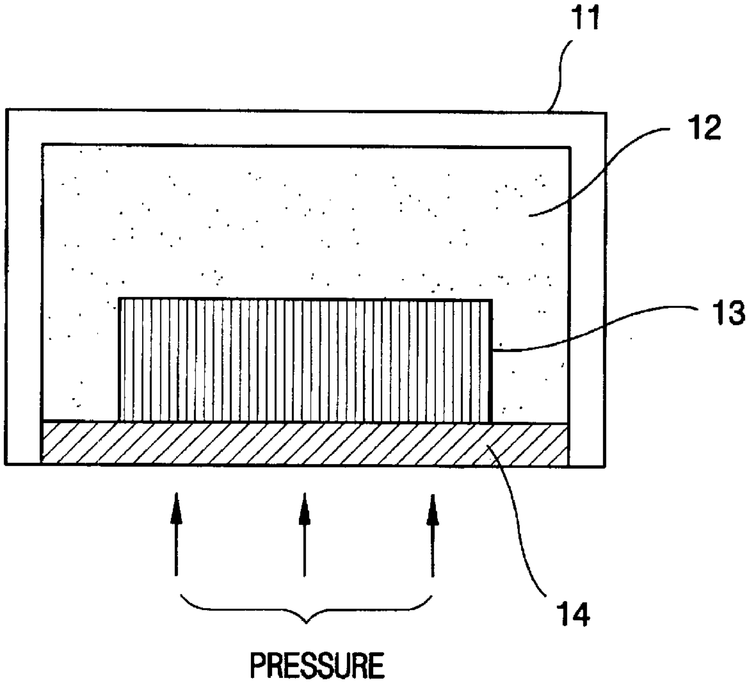
FIG. 1 is a state diagram of a conventional underwater acoustic transducer.
Figure 2:
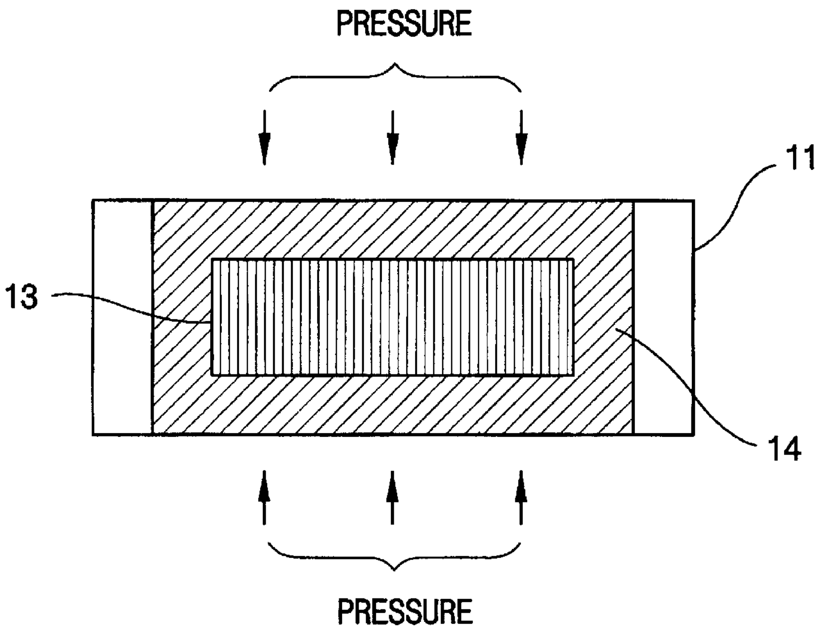
FIG. 2 is a state diagram showing the direction of a pressure applied to an oscillator unit of a transducer according to the present invention.
Figure 3:
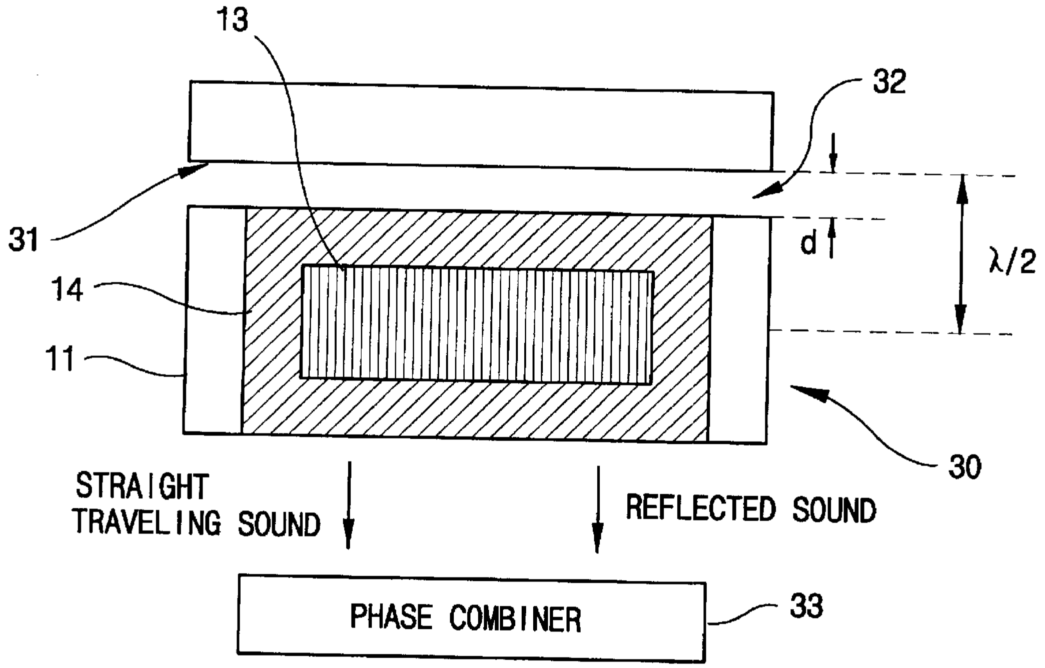
FIG. 3 is a schematic diagram of a pressure-balanced underwater acoustic transducer according to the present invention.

Referring to FIGS. 2 and 3, the construction of a transducer according to the present invention will first be described. There is provided an underwater acoustic transducer 70 configured to apply the same pressure to front and rear windows of an oscillator 13. The transducer 70 includes an oscillator unit 30 having the oscillator 13 oscillating by an electrical signal supplied to electrodes, provided on its front and rear surfaces, a sound transmission material 14 for transmitting sound from the oscillator 13, provided at its periphery, and a transducer housing 11 provided at the exterior of the sound transmission material 14. A sound reflector 31 for reflecting sound propagated from the oscillator 13 is positioned over the oscillator unit 30. A water entry layer 32 forms a space between the oscillator unit 30 and the sound reflector 31 to allow water to enter and exit to the rear window of the oscillator 13, thereby leading to a balanced state of pressures applied to the front and rear windows of the oscillator 13. Water in front of the acoustic window acts as a phase combiner 33, combining reflected sound from the sound reflector 31 and straight traveling sound.

As shown in FIG. 3, the above-described underwater acoustic transducer 70 including the oscillator unit 30, the sound reflector 31, the water entry layer 32 and the phase combiner 33, is characterized in that the oscillator 13 of the oscillator unit 30 is encapsulated by the sound transmission material 14, the sound transmission material 14 being preferably formed of polyurethane, and the water entry layer 32 for entry and exit of water is provided between the oscillator unit 30 and the sound reflector 31, the water entry layer 32 serving to apply the same pressure to the front and rear windows of the oscillator 13.

The length ranging from the oscillator 13 to the sound reflector 31 is most preferably a half wavelength of the sound wave from the transducer 70, that is, $\lambda/2$. Accordingly, the thickness d of the water entry layer 32 should be adjusted to the thickness at which phases of the straight traveling sound produced from the oscillator 13 and the sound reflected from the sound reflector 31 coincide with each other by measuring the phases of the combined sounds.

The straight traveling sound and the reflected sound are combined by the phase combiner 33 to have the same phase. The phase combiner 33 corresponds to the water medium itself through which sound is transmitted to the front side of the transducer 70. The amplitude of the waveforms becomes greatest when the phases are the same.

Figure 4:
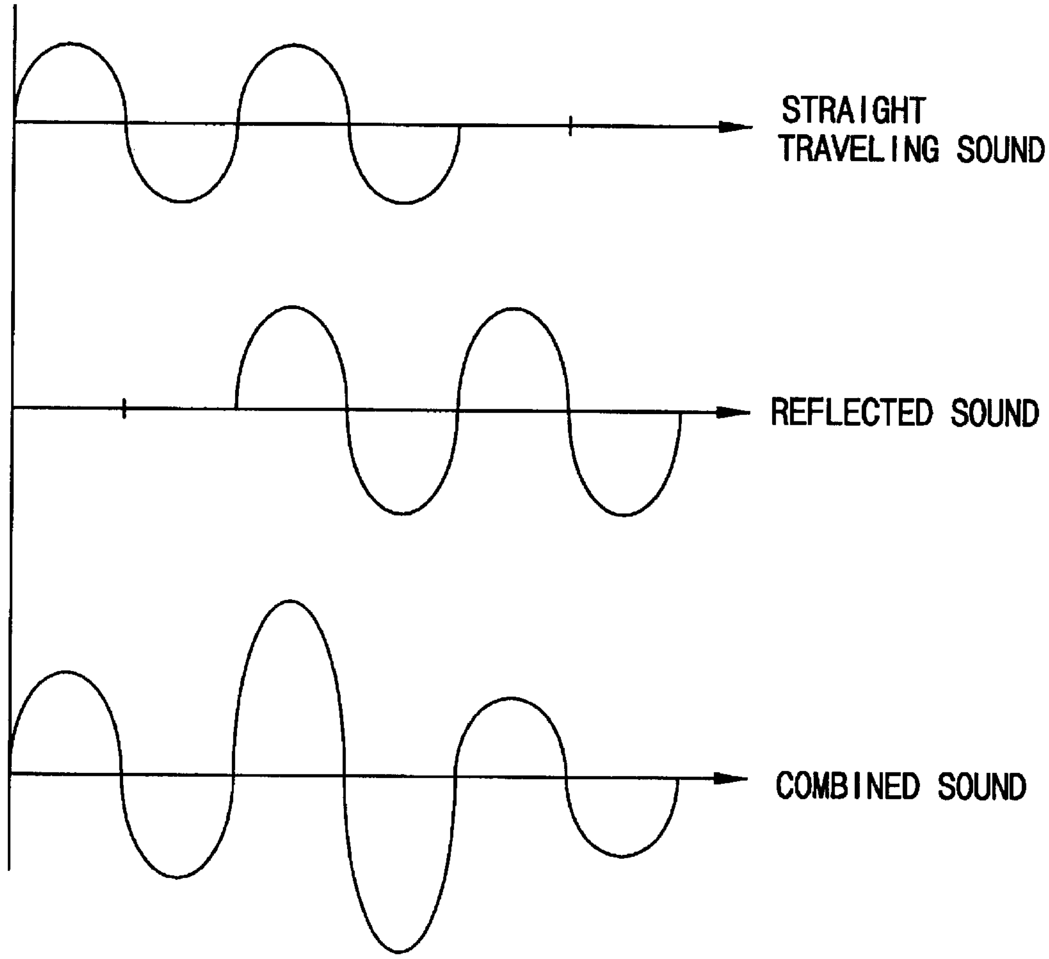
FIG. 4 is a waveform diagram of sound outputs from two electric pulses according to the present invention.

FIG. 4 shows theoretical waveforms of the phase of the straight traveling sound, the phase of the reflected sound and the sound having a combined phase. In practice, the aftershock or ringing of the oscillator 13 lasts for some time, but is not shown in FIG. 4.

Figure 5:
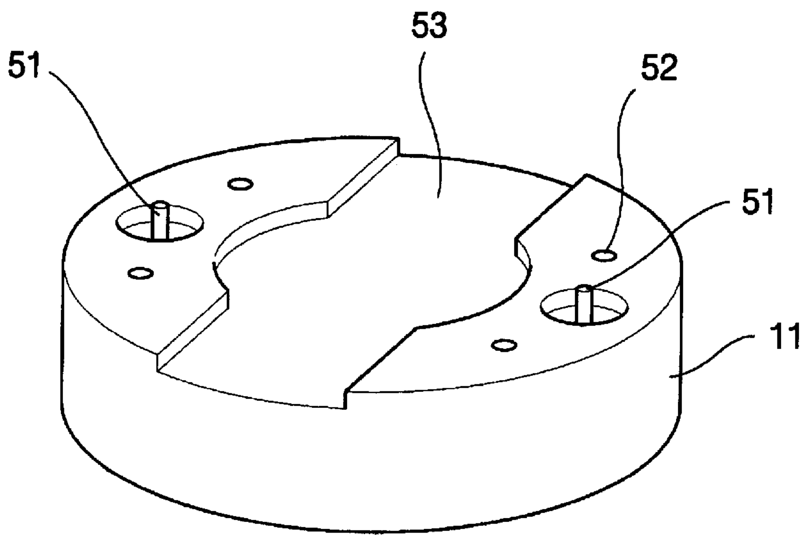
FIG. 5 is a perspective view showing the external shape of the transducer according to the present invention.

As shown in FIG. 5, the transducer 70 is externally shaped such that a platform 53 for forming the water entry layer 32 is provided in the center of the top surface of the cylindrical transducer housing 11, opposite transducer electrode terminals 51 project at left and right sides of the upper portion of the transducer 70, and assembly thread holes 52 are spaced apart from each other at both sides of the transducer electrode terminals 51 to connect the transducer housing 11 to the sound reflector 31.

In other words, the transducer housing 11 forming the external shape of the oscillator unit 30 and a sound reflector body 65 forming the external shape of the sound reflector 31 are separatably connected to each other. The thickness d of the water entry layer 32 is varied according to the distance between connected surfaces of the transducer housing 11 and the sound reflector body 65, thereby adjusting the phase of the sound reflected from the sound reflector 31.

Thus, the thickness d of the water entry layer 32 can be adjusted even after the transducer 70 is completely fabricated, thereby coinciding the phase of the reflected sound with the phase of the straight traveling sound.

Figure 6:
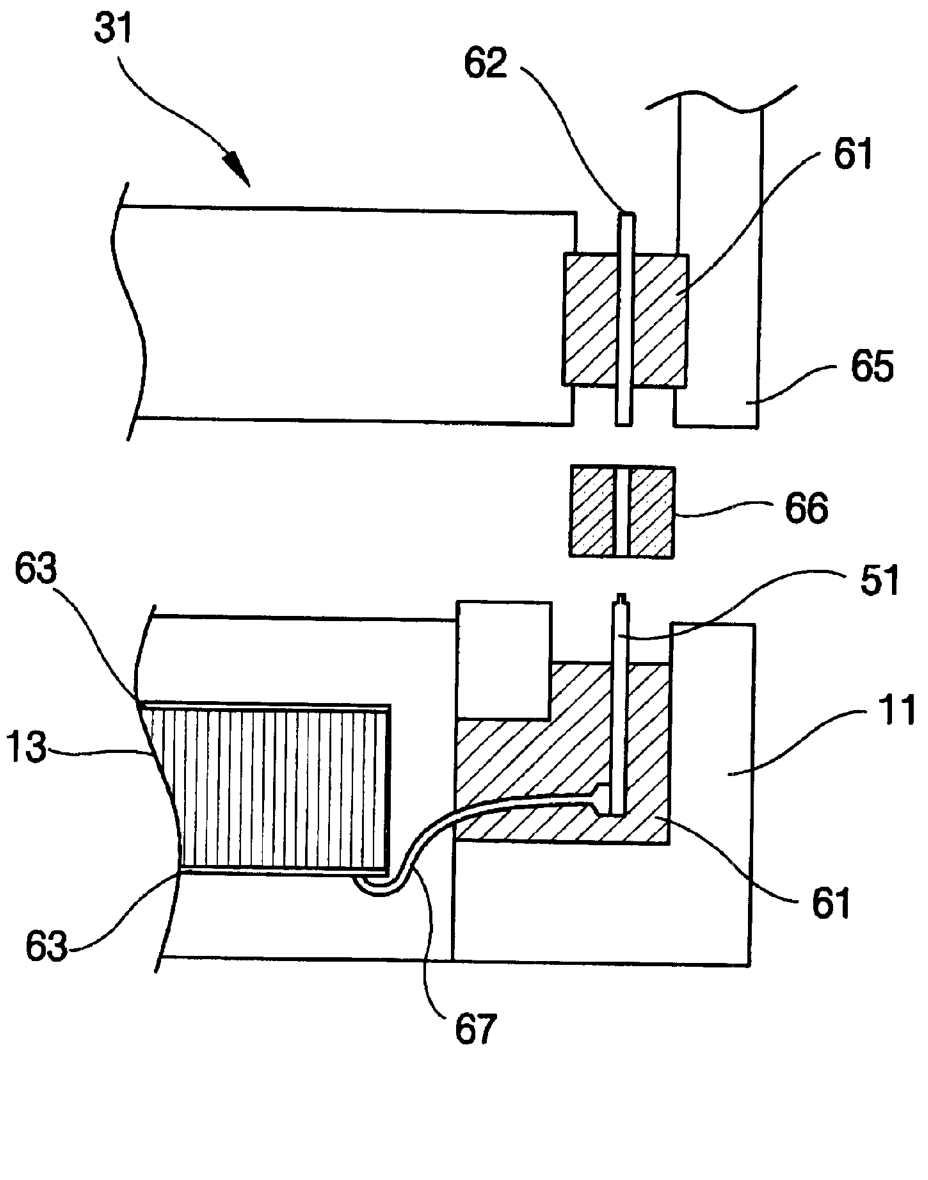
FIG. 6 is a diagram showing the state of connection between electrodes and a body of the transducer according to the present invention.

FIG. 6 is a diagram showing the state in which the transducer electrode terminals 51 installed in the transducer housing 11 are connected to an external connection terminals 62 of the sound reflector body 65. An electric wire 67 coupled to the electrode 63 of the oscillator 13 by soldering, is connected to the lower portion of the transducer electrode terminal 51. The transducer electrode terminal 51 and the external connection terminal 62 are molded using an epoxy 61 and are connected through a rubber ring 66, thereby the terminals are isolated from water.

Figure 7:
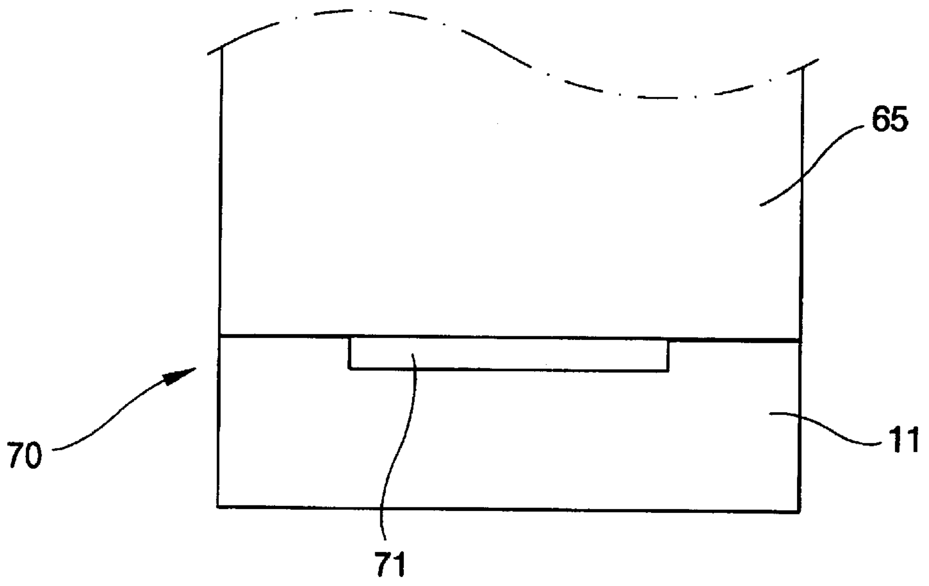
FIG. 7 is a diagram showing the assembled state of the transducer according to the present invention.

When the transducer housing 11 and the sound reflector body 65 are assembled as shown in FIG. 7, water entrance 71 are formed in the center of the top surface of the transducer housing 11, so that the same pressure is applied to the front and rear windows of the oscillator 13 through the water entrances 71.

As described above, in the underwater acoustic transducer according to the present invention, the effect of underwater pressure on an oscillator is balanced, thereby manufacturing a highly reliable, cost-effective underwater acoustic transducer for deep sea. Also, even when the transducer is used for shallow sea, little deformation occurs over usage time. Further, the phase of sound reflected from a sound reflector can be more simply adjusted, thereby effectively operating the device.

What is claimed is:

1. An underwater acoustic transducer comprising:

an oscillator unit including opposing first and second surfaces;

a sound reflector disposed over the first surface of the oscillator unit, for reflecting sound propagated from the oscillator unit;

a water flow layer formed in a space between the oscillator unit and the sound reflector, allowing water passage therethrough to form a balanced state of pressures applied to the first and second surfaces of the oscillator unit; and a phase combiner for combining sound reflected from the sound reflector and straight traveling sound propagated from the first surface of the oscillator into one single phase.

2. The underwater acoustic transducer of claim 1, wherein a phase of the sound reflected from the sound reflector is adjusted by varying a thickness of the water flow layer.

3. The underwater acoustic transducer of claim 2, wherein the thickness of the water flow layer is adjusted by varying a width of the space between the sound reflector and the oscillator unit.

4. The underwater acoustic transducer of claim 1, wherein the oscillator unit comprises an oscillator, an electrode for supplying an electric power to the oscillator, a sound transmission layer surrounding the oscillator, and a first housing disposed on an outer surface of the sound transmission layer.

5. The underwater acoustic transducer of claim 1, further comprising a second housing for supporting the sound reflector and the oscillator unit.

6. The underwater acoustic transducer of claim 4, further comprising a transducer electrode terminal electrically connected to the electrode of the oscillator.

7. The underwater acoustic transducer of claim 6, wherein the transducer electrode terminal is surrounded by a water insulating material.

* * * * *